(12) United States Patent
Feng

(10) Patent No.: US 11,259,427 B2
(45) Date of Patent: Feb. 22, 2022

(54) DISPLAY DEVICE AND DISPLAY EQUIPMENT

(71) Applicant: WUHAN CHINA STAR OPTOELECTRONICS SEMICONDUCTOR DISPLAY TECHNOLOGY CO., LTD., Hubei (CN)

(72) Inventor: Zikang Feng, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 22 days.

(21) Appl. No.: 16/957,769

(22) PCT Filed: Apr. 10, 2020

(86) PCT No.: PCT/CN2020/084088
§ 371 (c)(1),
(2) Date: Jun. 25, 2020

(87) PCT Pub. No.: WO2021/189543
PCT Pub. Date: Sep. 30, 2021

(65) Prior Publication Data
US 2021/0307182 A1    Sep. 30, 2021

(30) Foreign Application Priority Data
Mar. 25, 2020    (CN) .......................... 20201220511.X (51) Int. Cl.
*H05K 7/02* (2006.01)
*H05K 7/04* (2006.01)
*H05K 5/02* (2006.01)
*H05K 5/00* (2006.01)
*H01L 51/52* (2006.01)

(52) U.S. Cl.
CPC ......... *H05K 5/0217* (2013.01); *H05K 5/0017* (2013.01); *H01L 51/524* (2013.01); *H01L 2251/5338* (2013.01)

(58) Field of Classification Search
USPC ....................................................... 361/807
See application file for complete search history.

(56) References Cited

U.S. PATENT DOCUMENTS

| | | | | |
|---|---|---|---|---|
| 8,379,377 | B2* | 2/2013 | Walters | G06F 1/1652 361/679.04 |
| 9,164,538 | B2* | 10/2015 | Moscovitch | G06F 1/1601 |
| 11,005,516 | B2* | 5/2021 | Chen | G06F 1/1624 |
| 2008/0144265 | A1* | 6/2008 | Aoki | H04M 1/0268 361/679.04 |
| 2016/0004117 | A1 | 1/2016 | Yu et al. | |
| 2017/0332496 | A1* | 11/2017 | Choi | G09F 9/301 |
| 2018/0017994 | A1 | 1/2018 | Xu et al. | |

(Continued)

FOREIGN PATENT DOCUMENTS

| | | |
|---|---|---|
| CN | 103839493 A | 6/2014 |
| CN | 104075276 A | 10/2014 |

(Continued)

*Primary Examiner* — Hung S. Bui
(74) *Attorney, Agent, or Firm* — Mark M. Friedman (57) ABSTRACT

A display device and a display equipment are provided. The display device includes a frame and a flexible screen. A width of the frame is adjustable, and a width of the flexible screen is adjustable.

8 Claims, 9 Drawing Sheets

(56) References Cited

U.S. PATENT DOCUMENTS

| | | | |
|---|---|---|---|
| 2018/0102072 A1* | 4/2018 | Lee | G09G 3/20 |
| 2018/0103550 A1* | 4/2018 | Seo | H01F 7/0205 |
| 2019/0295403 A1 | 9/2019 | Lin et al. | |
| 2019/0297175 A1 | 9/2019 | Lin et al. | |
| 2020/0221051 A1 | 7/2020 | Cope et al. | |

FOREIGN PATENT DOCUMENTS

| | | |
|---|---|---|
| CN | 104851366 A | 8/2015 |
| CN | 106157816 A | 11/2016 |
| CN | 107331303 A | 11/2017 |
| WO | 2009089105 A1 | 7/2009 |

* cited by examiner

DISPLAY DEVICE AND DISPLAY EQUIPMENT

FIELD OF DISCLOSURE

The present disclosure relates to the field of displays, in particular to a display device and a display equipment.

BACKGROUND

At present, organic light emitting diodes (OLEDs) have attracted extensive attention due to their bendable and flexible properties. By folding or rolling up the OLED, a space occupied by a large-sized screen can be reduced, making it more portable. Therefore, foldable display equipment and flexible display equipment are main research directions of the flexible OLED.

SUMMARY OF DISCLOSURE

The present disclosure provides a display device and a display equipment for solving technical problems that a foldable device and a flexible device in the prior art cannot reduce a space occupied by the foldable device and the flexible device when realizing a large-size screen.

An embodiment of the present disclosure provides a display device including a frame and a flexible screen. A width of the frame is adjustable. The flexible screen is installed on the frame, and a width of the flexible screen is adjustable.

Furthermore, the frame includes a case, a first bracket, and a second bracket. The case is formed with a plurality of sliding chutes parallel to each other. Each sliding chute includes a first chute mouth and a second chute mouth opposite to the first chute mouth. The first bracket includes a first sliding block, and the first sliding block is slidably inserted into at least one sliding chute, and the first sliding block passes through the first chute mouth of the sliding chute. The second bracket includes a second sliding block, and the second sliding block is slidably inserted into at least one sliding chute, and the second sliding block passes through the second chute mouth of the sliding chute.

Furthermore, the first bracket includes a first box and a first scroll rotatably connected to two opposite inner walls of the first box, and a central axis of the first scroll is perpendicular to an extending direction of the sliding chutes. The second bracket includes a second box and a second scroll rotatably connected to two opposite inner walls of the second box, and a central axis of the second scroll is parallel to the central axis of the first scroll.

Furthermore, the display device further includes a first motor and a second motor. A rotor of the first motor is connected to the first scroll, and a rotor of the second motor is connected to the second scroll.

Furthermore, the flexible screen includes a central display area, a first extension area, and a second extension area, which are formed integrally. The central display area includes a first side and a second side opposite to the first side. One end of the first extension area is connected to the first side of the central display area, and another end of the first extension area is spirally sleeved on an outer wall of the first scroll and is connected to the first scroll. One end of the second extension area is connected to the second side of the central display area, and another end of the second extension area is spirally sleeved on an outer wall of the second scroll and is connected to the second scroll.

The present disclosure also provides a display equipment including the display device as mentioned above.

Furthermore, the display equipment further includes a first display device and a second display device. The first display device includes a first frame and a first flexible screen. The second display device includes a second frame and a second flexible screen, and the first flexible screen and the second flexible screen are formed integrally.

Furthermore, the display equipment further includes a connecting section, and two ends of the connecting section are rotatably connected to the first frame and the second frame, respectively.

Furthermore, the connecting section includes a shaft, a first connecting piece, and a second connecting piece. One end of the first connecting piece is rotatably connected to the shaft, and another end of the first connecting piece is fixedly connected to the first frame. One end of the second connecting piece is rotatably connected to the shaft, and another end of the second connecting piece is fixedly connected to the second frame.

Furthermore, the display equipment further includes a third flexible screen disposed on a surface of the connecting section, and the third flexible screen is formed integrally with the first flexible screen and the second flexible screen.

In the display device and the display equipment of the present disclosure, placing a part of the flexible screen inside the sliding block can reduce a size of the display device and is easy to carry. When in use, the flexible screen can be fully opened, which increases a display area and improves the user's visual experience. Two display devices are connected through the connecting section to make them into a display equipment with an inverted "H" shape. Moreover, by fully extending the flexible screen, one of the display devices realizes a display function of the display panel, and the other display device realizes a function of a touchable keyboard, so as to realize a transformation of a mobile phone and a notebook computer.

BRIEF DESCRIPTION OF DRAWINGS

The following describes the specific embodiments of the present disclosure in detail with reference to the accompanying drawings, which will make the technical solutions of the present disclosure and other beneficial effects obvious.

In the drawings:
10 display device; 100 frame;
200 flexible screen; 101 case;
102 first bracket; 103 second bracket;
1011 sliding chutes; 1012 first chute mouth;
1013 second chute mouth; 1021 first sliding block;
1022 first box; 300 flexible lock;
301 lock tongue; 302 latch;
3011 plane; 3012 curved surface;
1032 second box; 10221 first opening;
10222 first chamber; 1023 first scroll;
10321 second opening; 10322 second chamber;
1033 second scroll; 301 central display area;
302 first extension area; 303 second extension area;
11 first display device; 12 second display device;
131 shaft; 132 first connecting piece;
133 second connecting piece; 13 connecting section;
1321 first connection body; 1322 first connecting bracket;
1332 second connecting bracket; 13311 first connection cavity;
13312 second connection cavity

DETAILED DESCRIPTION

In order to more clearly describe the technical solutions of the embodiments of the present disclosure, accompanying drawings to be used in the detailed description of the disclosure will be briefly described hereinbelow. Obviously, the accompanying drawings described hereinbelow only illustrate some of the embodiments of the present disclosure, and those of ordinary skill in the art can also obtain other accompanying drawings therefrom without the need of making inventive efforts.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

First Embodiment

Figure 2:
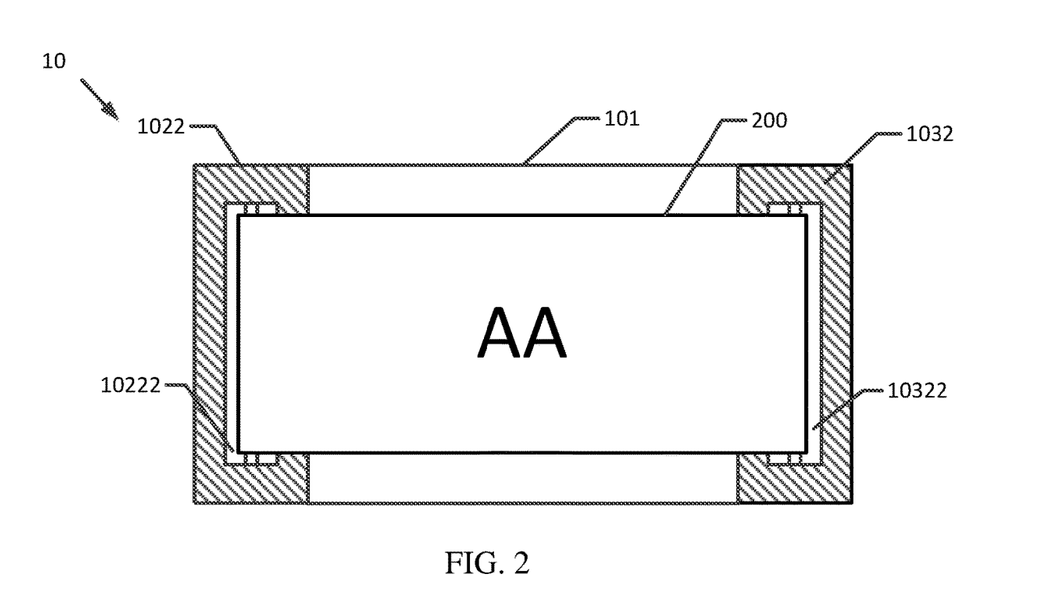
FIG. 2 is schematic diagram showing a display device in a collapsed state of the first embodiment.
Figure 3:
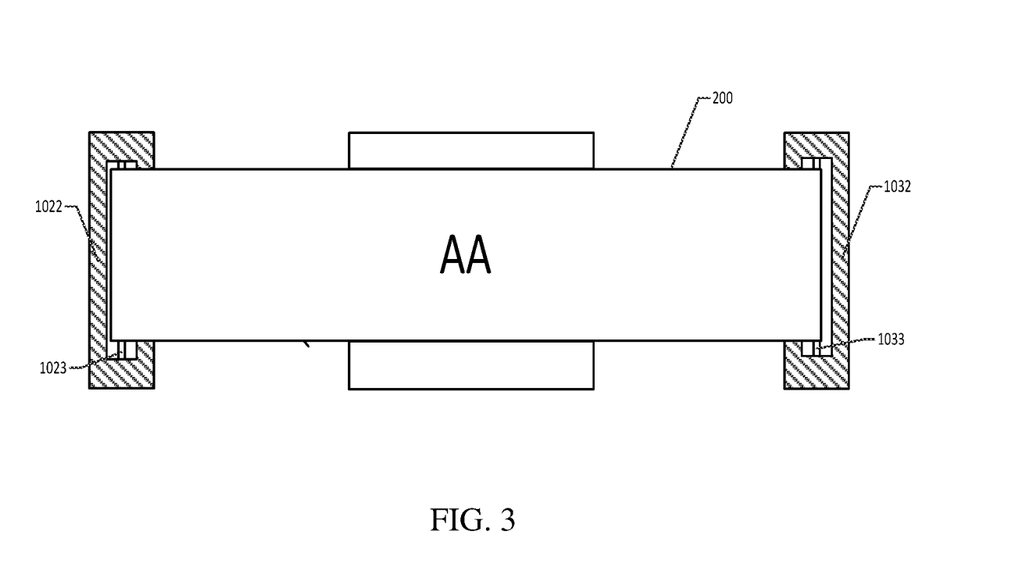
FIG. 3 is schematic diagram showing the display device in an extended state of the first embodiment.
Figure 4:
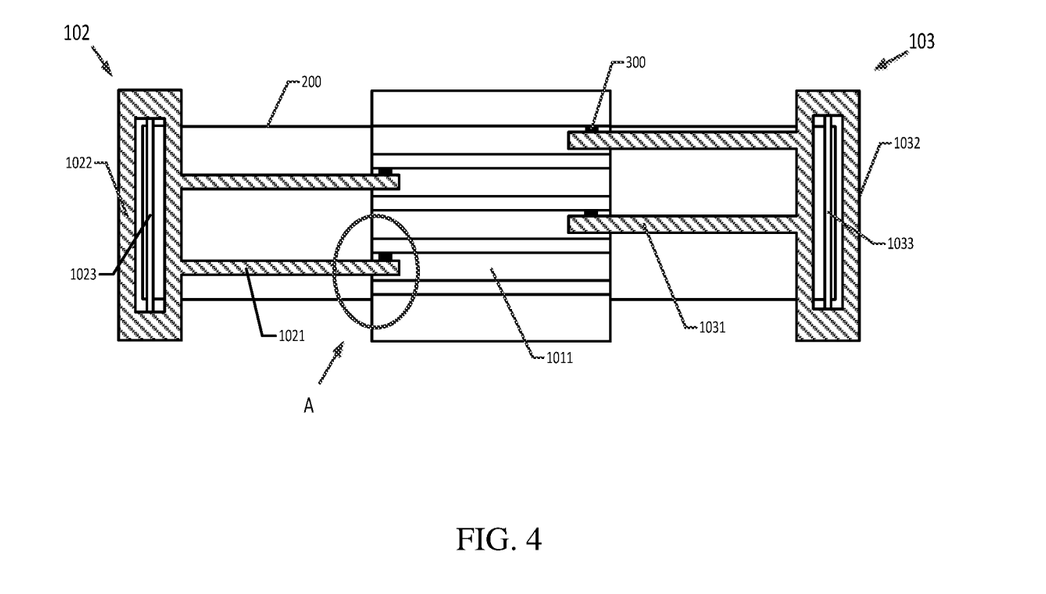
FIG. 4 is a cross-sectional view of the display device of the first embodiment.

Referring to FIG. 2, FIG. 3, and FIG. 4, FIG. 2 is schematic diagram showing a display device in a collapsed state of the first embodiment, FIG. 3 is schematic diagram showing the display device in an extended state of the first embodiment, and FIG. 4 is a cross-sectional view of the display device of the first embodiment.

A display device 10 includes a frame 100 and a flexible screen 200. A width of the frame 100 is adjustable. The flexible screen 200 is installed on the frame 100, and a width of the flexible screen 200 may change as the width of the frame changes.

Figure 1:
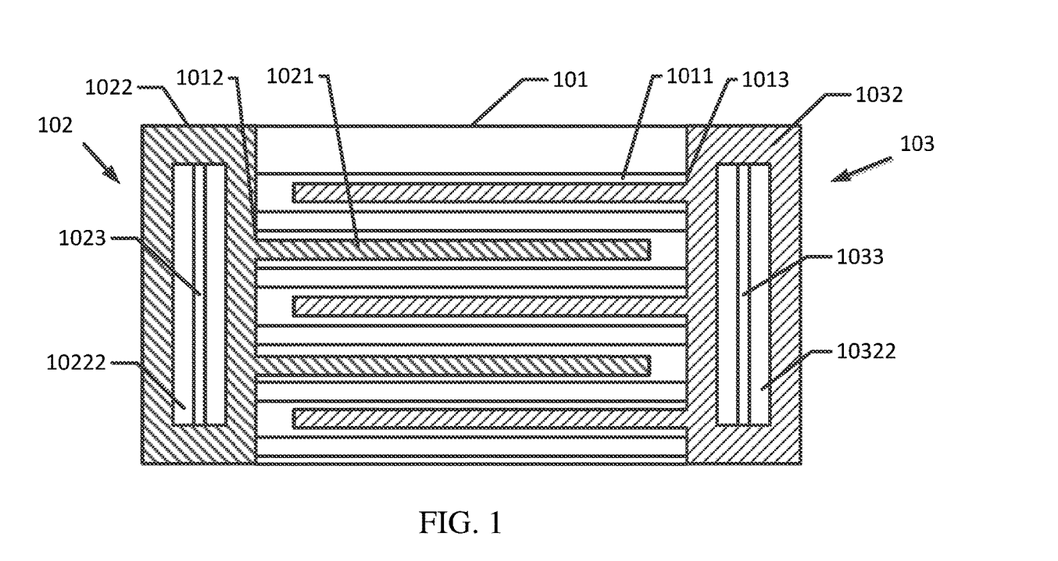
FIG. 1 is a schematic diagram of a frame of a first embodiment.

As shown in FIG. 1, which is a schematic diagram of the frame of the first embodiment.

The frame 100 includes a case 101, a first bracket 102, and a second bracket 103.

The case 101 is provided with a plurality sliding chutes 1011 parallel to each other. Two ends of each sliding chutes 1011 include a first chute mouth 1012 and a second chute mouth 1013. A direction of the openings of the first chute mouth 1012 and the second chute mouth 1013 is a width adjustment direction of the frame 100.

The first bracket 102 includes a first sliding block 1021 and a first box 1022. The first sliding block 1021 is an elongated sliding block, one end of which is connected to one side of the first box 1022, and the other end of which is slidably inserted into the sliding chute 1011 through the first chute mouth 1012. In order to make the first sliding block 1021 sliding smoothly in the corresponding sliding chute 1011, distances between two adjacent first sliding blocks 1021 are equal, and the two adjacent first sliding blocks 1021 are separated by at least one sliding chute 1011.

The first sliding block 1021 is connected to the side of the first box 1022. When the first box 1022 moves away from the case 101, the first sliding block 1021 slides in a direction toward the first chute mouth 1012 of the sliding chutes 1011. A brake locking mechanism is provided between the first sliding block 1021 and the corresponding sliding chute 1011 to limit a distance that the first sliding block 1021 slides out of the sliding chute 1011 and a position of the first sliding block 1021 so that it is in a stable state.

Figure 6:
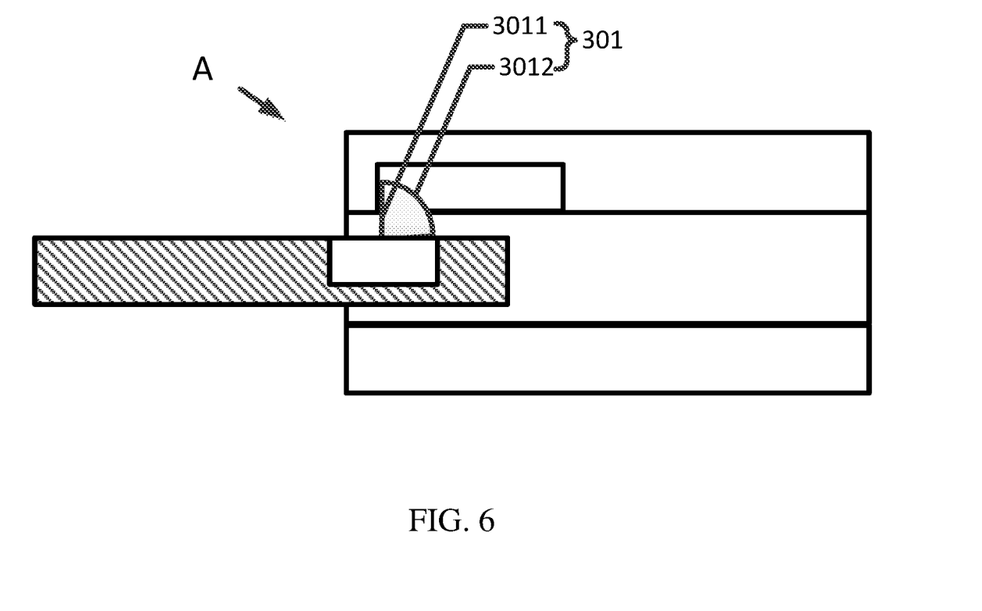
FIG. 6 is a schematic view of a flexible lock in a braking position of the first embodiment.
Figure 7:
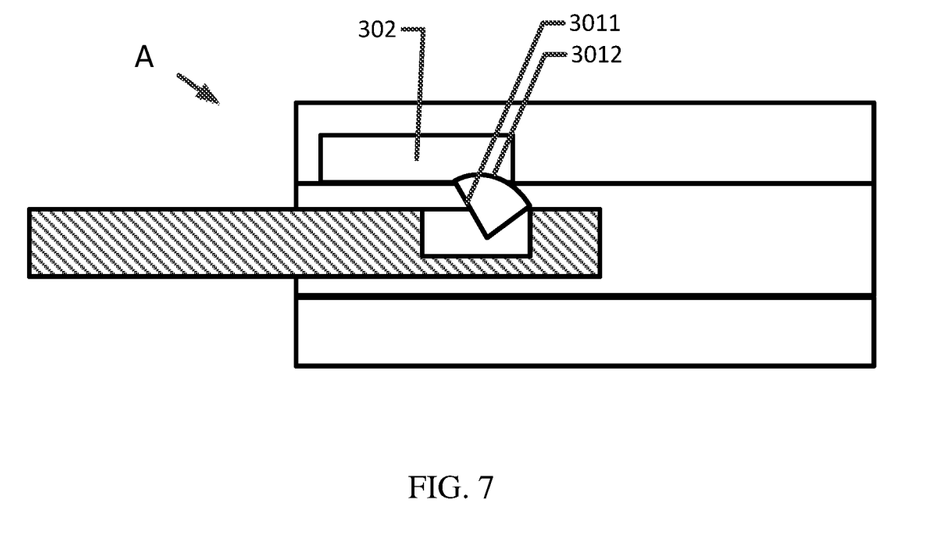
FIG. 7 is a schematic view of a flexible lock in a return position of the first embodiment.
Figure 8:
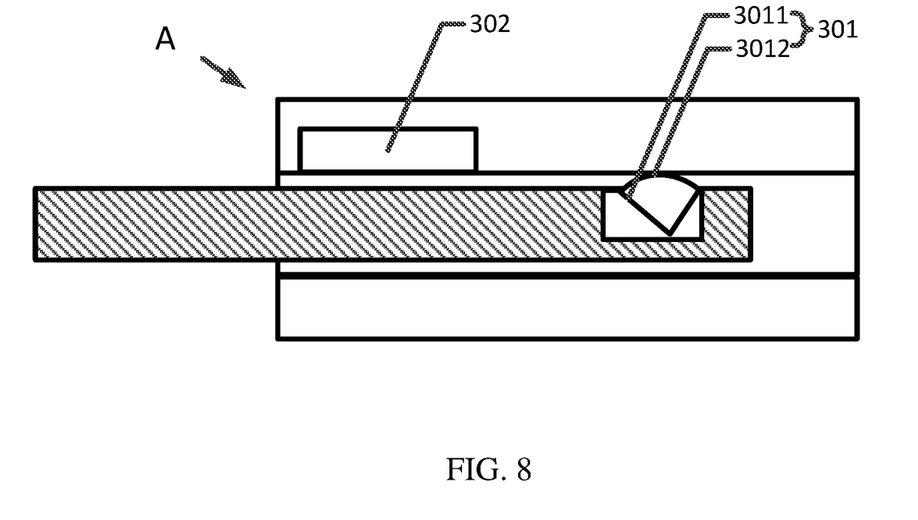
FIG. 8 is a schematic view of a flexible lock in a retracted position of the first embodiment.

Referring to FIG. 6. FIG. 7, and FIG. 8, FIG. 6 is a schematic view of a flexible lock in a braking position of the first embodiment, FIG. 7 is a schematic view of a flexible lock in a return position of the first embodiment, and FIG. 8 is a schematic view of a flexible lock in a retracted position of the first embodiment.

In this embodiment, the flexible lock 300 serves as a braking device of first sliding block 1021 and sliding chute 1011. Specifically, the flexible lock 300 includes a lock tongue 301 and a latch 302. The lock tongue 301 is a flexible lock tongue and is elastically arranged inside the first sliding block 1021. A shape of the lock tongue 301 is a fan-shaped protruding structure, including a plane 3011 and a curved surface 3012. When the lock tongue 301 and the latch 302 are "misaligned", the lock tongue 301 overcomes an elastic force and is completely disposed on an inside of the first sliding block 1021. One side of the curved surface 3012 of the lock tongue 301 faces the sliding chute 1011 and is always tangent to an inner wall of the sliding chute 1011. When the lock tongue 301 and the latch 302 face each other, the lock tongue 301 pops out from the inside of the first sliding block 1021, and one side of the plane 3011 of the lock tongue 301 pops out from the inside of the first sliding block 1021 and abuts a side wall of the latch 302, thereby achieving a purpose of braking the first sliding block 1021.

A relative position of the lock tongue 301 and the latch 302 changes as the first sliding block 1021 slides on the sliding chute 1011. When the first sliding block 1021 moves back from the braking position, a side wall of the latch 302 away from the plane 3011 abuts the curved surface 3012. Due to a curvature of the curved surface 3012, the lock tongue 301 will be retracted into the first sliding block 1021 under an external force of the latch 302 to overcome an elastic modulus.

The latch 302 is located at the sliding chute 1011 near the first chute mouth 1012. In order to ensure that the first sliding block 1021 can slide freely within the sliding chute 1011, there is a safe distance between the latch 302 and the first chute mouth 1012, thereby preventing the first sliding block 1021 from completely separating from the sliding chute 1011 during the sliding process.

The first box 1022 includes a first opening 10221 and a first chamber 10222 corresponding to the first opening 10221. An outer wall of the first box 10221 is fixedly connected to the first sliding block 1021, so that a position of the first box 10221 relative to the first chute mouth 1012 can change as the first sliding block 1021 moves within the sliding chute 1011.

The first bracket 103 also includes a first scroll 1023. The first scroll 1023 is rotatably connected to the first chamber 10222. Specifically, both ends of an axial of the first scroll 1023 are rotatably connected to side walls of the first chamber 10222 corresponding to the first chute mouth 1012. There is a gap between an outer wall of the first scroll 1023 and an inner wall of the first chamber 1022.

The flexible screen 300 includes a central display area 301, a first extension area 302, and a second extension area 303.

The central display area 301 is disposed directly above the case 101. In an embodiment of the present disclosure, since the sliding chute 1011 adopts a U-shaped sliding chute, that is, the sliding chute 1011 has an opening 1014 in addition to the first chute mouth 1012 and the second chute mouth 1013. For ease of processing, a direction of the opening 1014 is a direct direction when a user uses the display device 10, that is, the case 101 is near the central display area 301.

Figure 5:
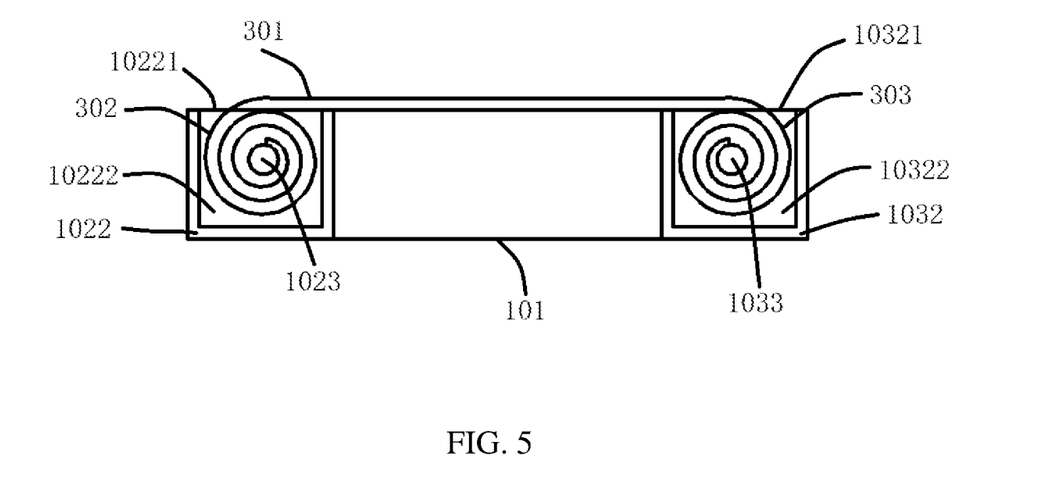
FIG. 5 is a side view of the display device of the first embodiment.

As shown in FIG. 5, which is a side view of the display device of the first embodiment. The central display area 301 also includes a first side 3011 and a second side 3012. The first side 3011 is connected to one end of the first extension area 302. The connection between the first extension area 302 and the first side 3011 is always under tension. The second side 3012 is connected to one end of the second extension area 303. The connection between the second extension area 303 and the second side 3012 is always under tension, and the central display area 301 is always under tension.

One end of the first extension area 302 away from the first side 3011 passes through the first opening 10221 and is spirally sleeved on an outer wall of the first scroll 1023 and connected to the outer wall of the first scroll 1023. When a rotation direction of the scroll 1023 faces away from the case 101, the first extension area 302 spirals away from an inside of the first chamber 10222 and gradually flattens on the first sliding block 1021 exposed outside the sliding chute 1011 until the first sliding block 1021 reaches a braking distance. When the rotation direction of the scroll 1023 is toward the case 101, the first extension area 302 is spirally sleeved on the scroll 1023 with the rotation direction of the scroll 1023 and placed in the first chamber 10222.

The second bracket 103 includes a second sliding block 1031 and a second box 1032. The second sliding block 1031 is an elongated sliding block, one end of which is connected to one side of the second box 1032 and the other end of which is slidably inserted into the sliding chute 1011 through the second chute mouth 1032.

The same device as the flexible lock 300 is also arranged between the second sliding block 1031 and the sliding chute 1011. The latch corresponding to the lock tongue set on the second sliding block 1031 is disposed near the second chute mouth 1032 of the sliding chute 1011.

A sliding direction of the first sliding block 1021 is opposite to that of the second sliding block 1031. The first sliding block 1021 and the second sliding block 1031 are alternatively inserted into the sliding chutes 1011. It is beneficial for the first bracket 102 and the second bracket 103 to be evenly stressed, thereby improving a lifespan of the display device 10.

In order to enable the first scroll 1023 and the second scroll 1033 to rotate autonomously, the display device 10 further includes a first motor and a second motor. The first motor has a first rotor. The first rotor is connected to the first scroll 1023 to control a rotation of the first scroll 1023. Specifically, a rotation direction of the first rotor includes a first direction and a second direction.

The second motor has a second rotor. The second rotor is connected to the second scroll 1033 to control a rotation of the second scroll 1033. Specifically, a rotation direction of the second rotor includes a third direction and a fourth direction. The first direction and the third direction are parallel to each other and opposite directions. The second direction and the fourth direction are parallel to each other and opposite directions.

Second Embodiment

Figure 9:
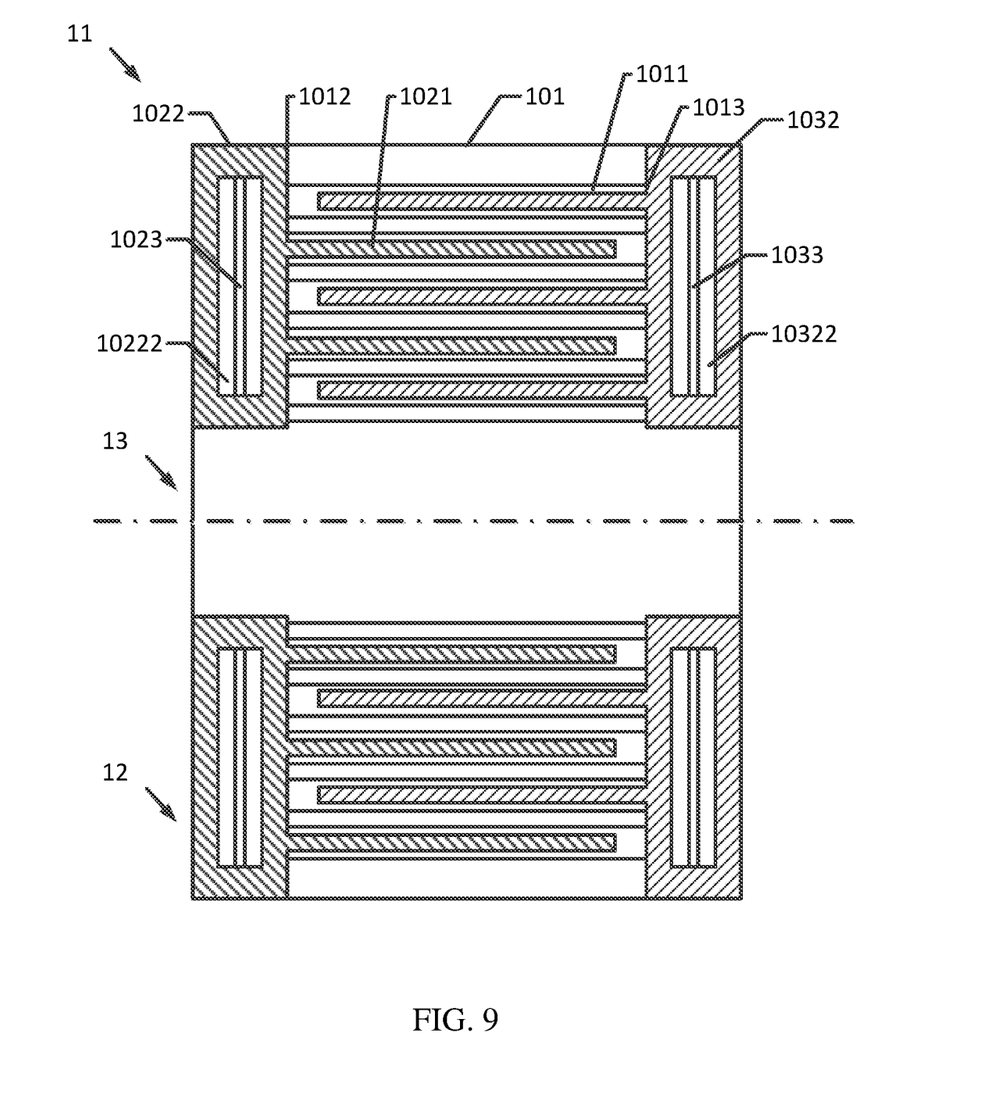
FIG. 9 is a partial schematic diagram of a display equipment of a second embodiment.
Figure 10:
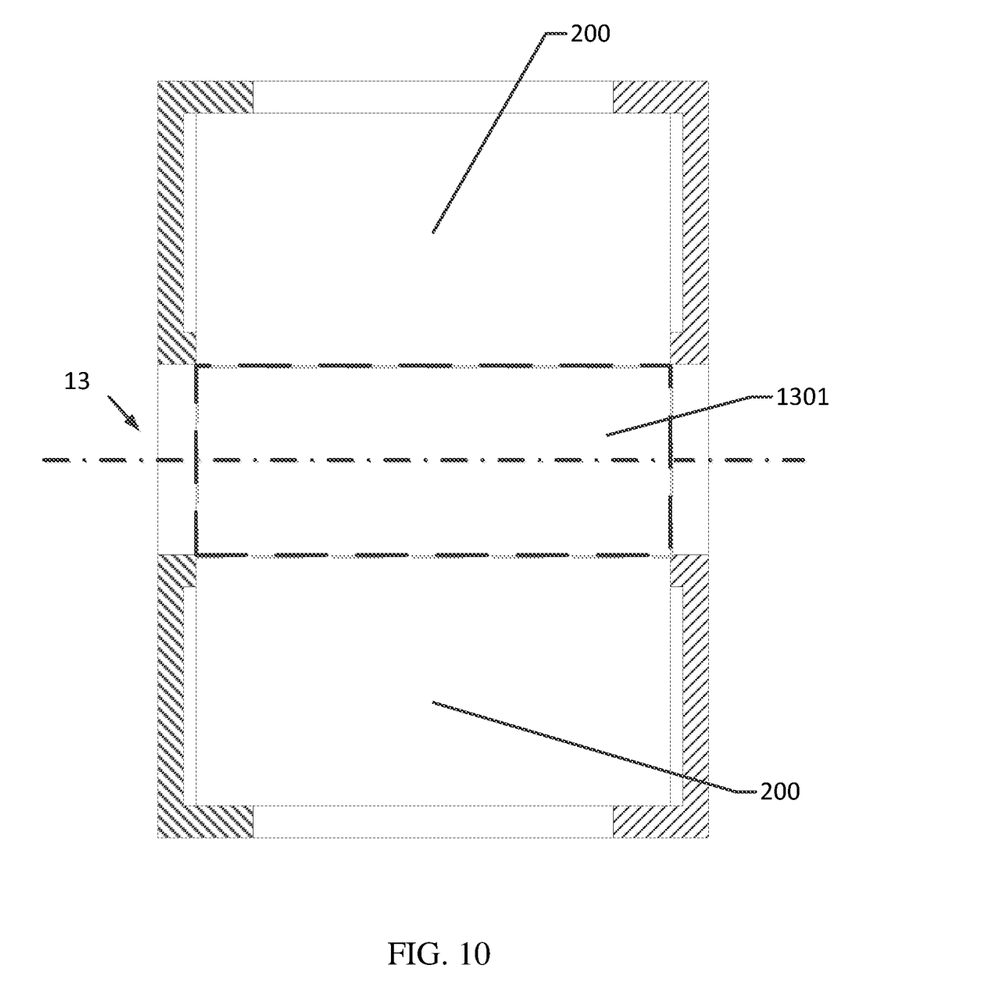
FIG. 10 is schematic diagram showing the display equipment in a collapsed state of the second embodiment.
Figure 11:
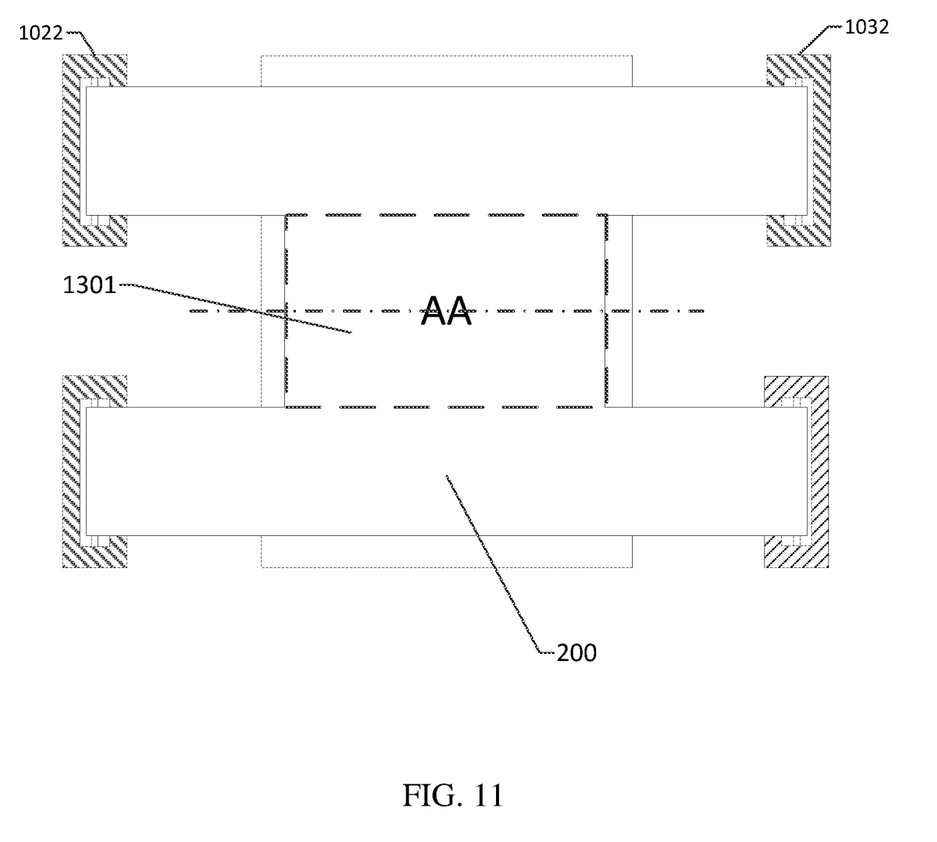
FIG. 11 is schematic diagram showing the display equipment in an extended state of the second embodiment.

Referring to FIG. 9, FIG. 10, and FIG. 11, FIG. 9 is a partial schematic diagram of a display equipment of a second embodiment, FIG. 10 is schematic diagram showing the display equipment in a collapsed state of the second embodiment, and FIG. 11 is schematic diagram showing the display equipment in an extended state of the second embodiment.

In this embodiment, the display equipment includes a first display device 11, a second display device 12, and a connecting section 13. The connecting section 13 includes a central axis. The first display device 11 and the second display device 12 are symmetrical about the central axis.

The first display device 11 has the same structure as the display device 10 in the first embodiment.

Figure 12:
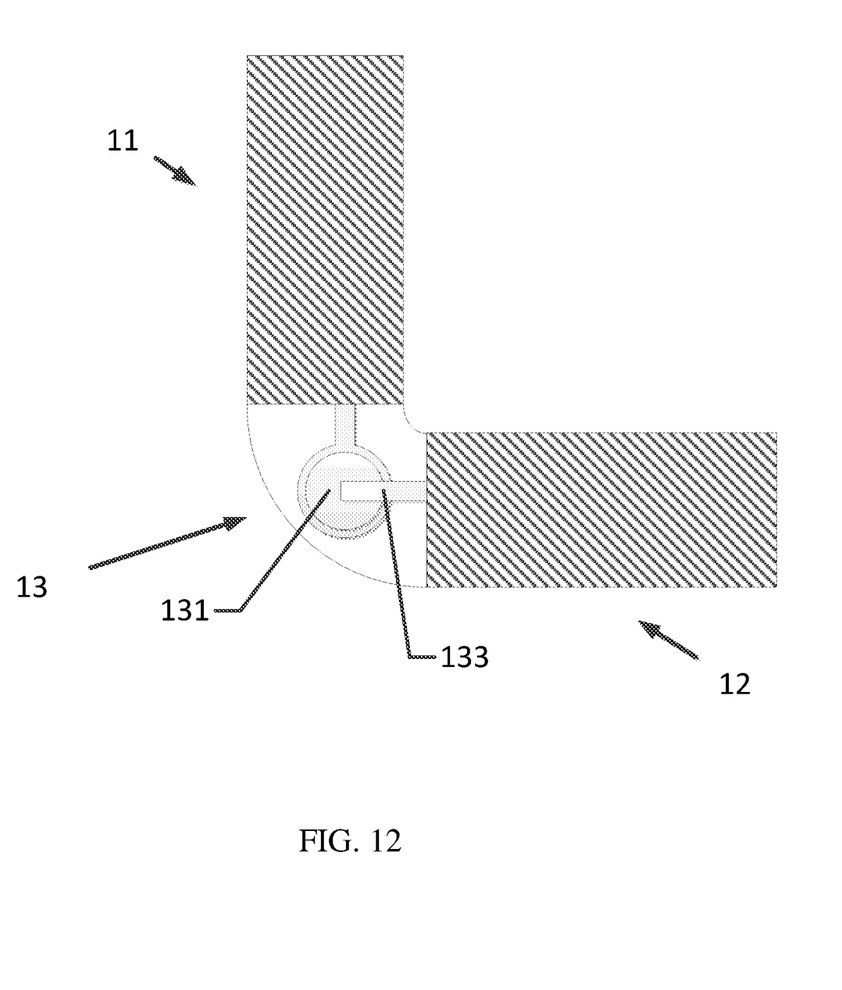
FIG. 12 is schematic diagram of a connecting section of the second embodiment.
Figure 13:
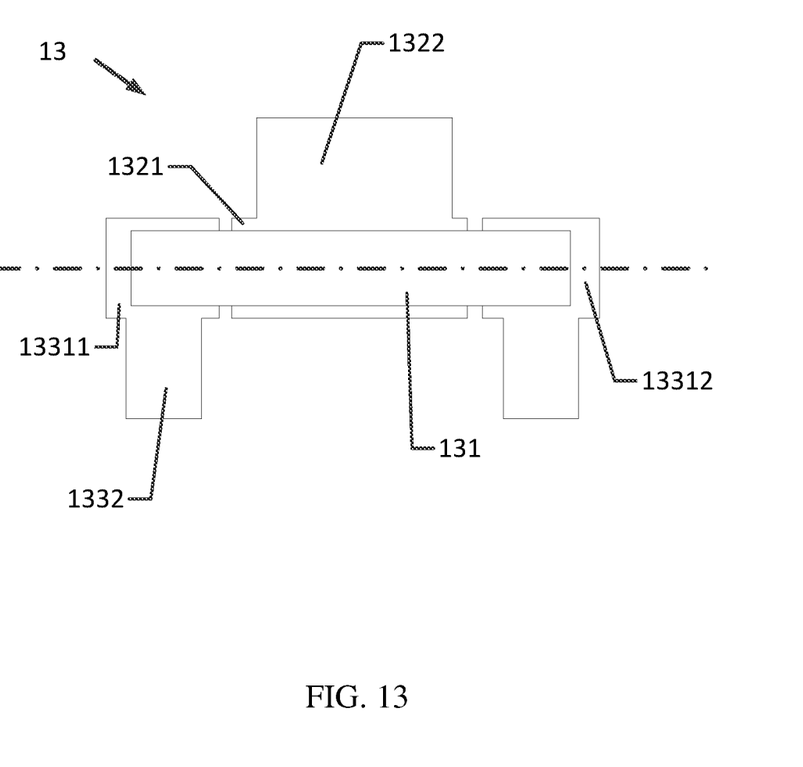
FIG. 13 is cross-sectional view of the connecting section of the second embodiment.

Referring to FIG. 12 and FIG. 13, FIG. 12 is schematic diagram of a connecting section of the second embodiment and FIG. 13 is cross-sectional view of the connecting section of the second embodiment. The connecting section 13 includes a shaft 131, a first connecting piece 132, and a second connecting piece 133. An axis of the shaft 131 coincides with the central axis of the connecting section 13.

The first connecting piece 132 includes a first connection body 1321 and a first connecting bracket 1322. A shape of the first connection body 1321 is a hollow cylinder. An inner diameter of the first connection body 1321 matches an outer diameter of the shaft 132. The first connection body 1321 is sleeved on the shaft 132. A flat key is also provided between the first connection body 1321 and the shaft 132 to axially fix the first connection body 1321 and the shaft 132, thereby achieving a function of transmitting torque.

One end of the first connecting bracket 1322 is connected to an outer wall of the first connection body 1321, and the other end of which is connected to one end of the case 101 of the first display device 11. Specifically, the end is connected to a side of the case 101 parallel to a sliding direction of the sliding chute 1011.

The second connecting piece 133 includes a second connection body and a second connecting bracket 1332. The second connection body includes a first connection cavity 13311 and a second connection cavity 13312. Openings of the first connection cavity 13311 and the second connection cavity 13312 are oppositely arranged. A distance between the first connection cavity 13311 and the second connection cavity 13312 is greater than an axial distance of the first connection body 1321 on the connecting shaft 131. After the shaft 131 is sleeved within the first connection body 1321, axial ends of the shaft 131 are rotatably inserted into the first connection cavity 13311 and the second connection cavity 13312. A rotation mode of the shaft 131 includes a gear rotation, a belt drive, or motor rotation, which is not limited here.

One end of the second connecting bracket 1332 is connected to the second connection body 1331, and the other end of which is connected to the second display device 12.

There is a second flexible screen 1301 on one side of the connecting section 13. One end of the second flexible screen 1301 is formed integrally with the flexible screen 100 of the first display device 11. The other end of the second flexible screen 1301 is formed integrally with the flexible screen 100 of the second display device 12, thereby ensuring a display quality of the display equipment 1.

The description about the embodiments is merely provided to help understand the technical solutions and core ideas of the present disclosure. Those of ordinary skill in the art should understand that they can still modify the technical solutions described in the foregoing embodiments, or equivalently replace some of the technical features. These modifications or replacements do not deviate the essence of the corresponding technical solutions from the scope of the technical solutions of the embodiments of the present disclosure.

What is claimed is:

1. A display equipment, comprising:
    a first display device comprising:
        a first frame, wherein a width of the first frame is adjustable; and
        a first flexible screen installed on the first frame, wherein a width of the first flexible screen is adjustable; and
    a second display device comprising:
        a second frame, wherein a width of the second frame is adjustable; and
        a first flexible screen installed on the second frame, wherein a width of the second flexible screen is adjustable;
    wherein the first flexible screen and the second flexible screen are formed integrally.

2. The display equipment as claimed in claim 1, wherein both the first frame and the second frame comprise:
    a case formed with a plurality of sliding chutes parallel to each other, wherein each sliding chute comprises a first chute mouth and a second chute mouth opposite to the first chute mouth;
    a first bracket comprising a first sliding block, wherein the first sliding block is slidably inserted into at least one sliding chute, and the first sliding block passes through the first chute mouth of the sliding chute; and
    a second bracket comprising a second sliding block, wherein the second sliding block is slidably inserted into at least one sliding chute, and the second sliding block passes through the second chute mouth of the sliding chute.

3. The display equipment as claimed in claim 2, wherein the first bracket comprises a first box and a first scroll rotatably connected to two opposite inner walls of the first box, wherein a central axis of the first scroll is perpendicular to an extending direction of the sliding chutes; and
    wherein the second bracket comprises a second box and a second scroll rotatably connected to two opposite inner walls of the second box, wherein a central axis of the second scroll is parallel to the central axis of the first scroll.

4. The display equipment as claimed in claim 3, further comprising:
    a first motor, wherein a rotor of the first motor is connected to the first scroll; and
    a second motor, wherein a rotor of the second motor is connected to the second scroll.

5. The display equipment as claimed in claim 1, wherein both the first flexible screen and the second flexible screen comprise a central display area, a first extension area, and a second extension area, which are formed integrally;
    wherein the central display area comprises a first side and a second side opposite to the first side;
    wherein one end of the first extension area is connected to the first side of the central display area, and another end of the first extension area is spirally sleeved on an outer wall of the first scroll and is connected to the first scroll; and
    wherein one end of the second extension area is connected to the second side of the central display area, and another end of the second extension area is spirally sleeved on an outer wall of the second scroll and is connected to the second scroll.

6. The display equipment as claimed in claim 1, further comprising a connecting section, wherein two ends of the connecting section are rotatably connected to the first frame and the second frame, respectively.

7. The display equipment as claimed in claim 6, wherein the connecting section comprises:
    a shaft;
    a first connecting piece, wherein one end of the first connecting piece is rotatably connected to the shaft, and another end of the first connecting piece is fixedly connected to the first frame; and
    a second connecting piece, wherein one end of the second connecting piece is rotatably connected to the shaft, and another end of the second connecting piece is fixedly connected to the second frame.

8. The display equipment as claimed in claim 1, further comprising a third flexible screen disposed on a surface of the connecting section, wherein the third flexible screen is formed integrally with the first flexible screen and the second flexible screen.

* * * * *